United States Patent [19]
Eller

[11] Patent Number: 5,220,519
[45] Date of Patent: Jun. 15, 1993

[54] METHOD AND APPARATUS FOR SELF-TESTING A TRANSDUCER SYSTEM

[75] Inventor: Eldon E. Eller, Laguna Hills, Calif.

[73] Assignee: Endevco Corporation, San Juan Capistrano, Calif.

[21] Appl. No.: 635,055

[22] Filed: Dec. 28, 1990

[51] Int. Cl.$^5$ ............................................. G01R 31/28
[52] U.S. Cl. .................................. 364/579; 364/574; 371/15.1
[58] Field of Search ................... 364/579, 556, 571.01, 364/553, 554, 572, 574, 571.02, 571.06; 371/15.1, 25.1

[56] References Cited

U.S. PATENT DOCUMENTS

| 4,093,988 | 6/1978 | Scott | 364/579 |
| 4,860,227 | 8/1989 | Tamamura | 364/550 |

FOREIGN PATENT DOCUMENTS 0126322  11/1984  United Kingdom .

OTHER PUBLICATIONS

Briggs et al.; Correlation Analysis of Process Dynamics Using Pseudo-Random Binary Test Perturbations; Proc. Instn. Mech. Engrs; 1964-1965 vol. 179, Pt 3H; pp. 37-51.

Primary Examiner—Parshotam S. Lall
Assistant Examiner—Michael Zanelli
Attorney, Agent, or Firm—Hamilton, Brook, Smith & Reynolds

[57] ABSTRACT

A method and apparatus for self-testing a transducer system. A signal generator is used to generate a predetermined sequence of signals or pulses, and the sequence has a finite test-time duration. The self-test signal also has the properties that its time varying part: (1) sums to zero over the test time interval; and (2) it has a relatively flat frequency spectrum. Additionally, calculations are made even simpler if the self-test signal is chosen to switch at pseudo random intervals between two fixed values. The output of the self-test system has one term which is directly proportional to the transducer system sensitivity and represents the desired self-test result, and one or more error terms which tend toward zero as the test-time duration increases. The self-testing system of the present invention may be implemented either in analog circuitry, digital logic, or a combination thereof. Preferably the transducer system is operatively disposed on an integrated circuit chip, and self-testing system of the present invention is similarly situated on the same integrated circuit chip.

38 Claims, 4 Drawing Sheets

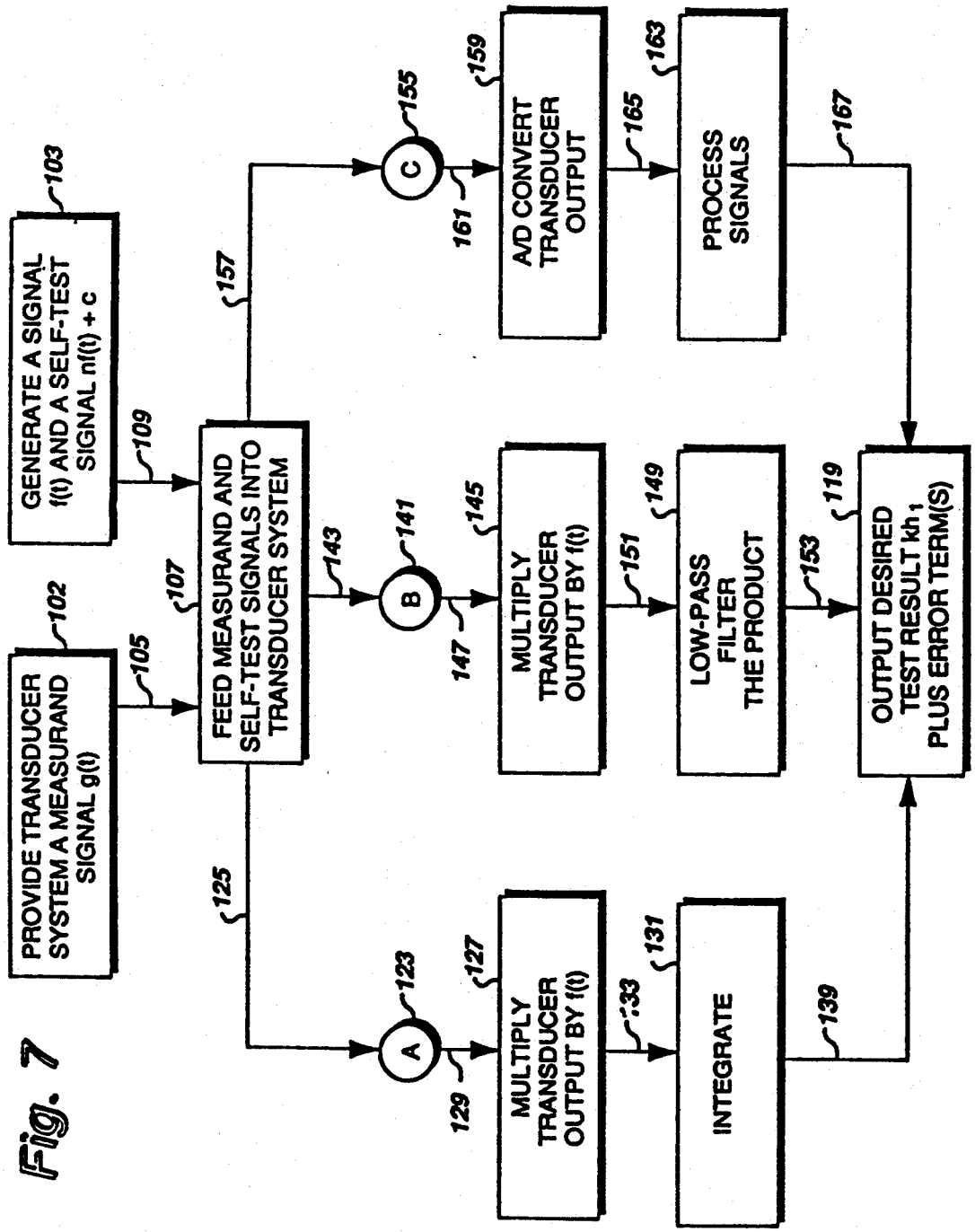

METHOD AND APPARATUS FOR SELF-TESTING A TRANSDUCER SYSTEM

BACKGROUND OF THE INVENTION

1. Field of the Invention

This invention relates generally to a method and apparatus for self-testing a transducer system. The sensitivity of the system is determined by measuring the average value of the product of a test signal and the system output with the test signal applied. Any constant component of the test signal is removed before the product taken. Optimum performance is obtained by utilizing a random or pseudo-random test signal. The method and apparatus may utilize either analog or digital techniques.

2. Description of the Prior Art

The prior art includes self-testing systems for use with transducers and their associated circuitry. However, most prior art systems run the self-test while the transducer system itself is not operational for its intended purpose or not receiving environmental signals.

Those prior art systems that do run a self-test while the transducer system is operational, usually produce a highly inaccurate or ambiguous test result output which has a relatively low reliability due to the presence of very significant noise and/or error terms.

The present invention provides an improved method and apparatus for self-testing transducer systems while they are operational, while simultaneously providing for a high degree of accuracy in the test result output signal. This method and apparatus uses a uniquely-tailored self-testing signal selected to have specific properties which guarantee the minimization of the magnitude of the error terms produced.

In fact, the method and apparatus of the present invention provide a highly accurate and unambiguous test result along with one or more error or noise terms whose values tend to zero over the test time period and whose magnitudes decrease as the test time increases.

Therefore, the present invention solves substantially all of the problems of the prior art, while simultaneously avoiding any of its shortcomings and new problems, by utilizing an improved method and apparatus of self-testing with a self-test signal having unique properties, as described herein.

SUMMARY OF THE INVENTION

It is an object of the present invention to provide a method for self-testing a transducer system.

It is another object of this invention to provide a method of self-testing a transducer system which yields the desired self-test result which is highly accurate and unambiguous plus one or more error or noise terms whose magnitudes or values decrease as the test time increases.

It is a further object of this invention to provide a self-testing method for transducer systems wherein the self-test signal is a random or pseudo-random sequence of signals having a finite time duration.

It is still another object of the present invention to provide such a method wherein the self-test signal is also restricted to two fixed values, sums to the average of those values over the test time interval, and has a relatively flat frequency spectrum.

It is still a further object of the present invention to provide such a self-test signal which is also unidirectional.

It is yet another object of the present invention to provide such a system which may be implemented in analog circuitry.

It is still another object of the present invention to provide a system, circuit, or apparatus for self-testing a transducer system.

It is still a further object of this invention to provide a self-test system for a transducer system wherein both the transducer system and the self-test system are operatively disposed on the same integrated circuit chip.

It is yet another object of this invention to provide a self-testing system for a transducer system which includes signal-generating means for producing a self-test signal which comprises a random or pseudo-random sequence of signals having a finite test time duration.

It is another object of the present invention to provide such a system wherein the generated self-test signal further includes the properties that it is restricted to two fixed values; it sums to the average of those two values over the test time period; and it has a relatively flat frequency spectrum.

It is a further object of the present invention to provide such a self-test signal which is also unidirectional.

It is still an other object of the present invention to provide such a system wherein the self-test signal output has one term indicative of a highly accurate representation of the desired self-test result, and one or more error terms whose magnitudes or values decrease with increases in the test time duration.

It is still a further object of the present invention to provide such a system which includes analog circuit means.

It is yet another object of this invention to provide such a system which includes digital logic means.

It is another object of the present invention to provide a self-testing system for use in a transducer system wherein the self-testing system includes means for generating a unique, custom-tailored self-testing signal.

It is a further object of the present invention to provide both an improved method and apparatus for self-testing a transducer system and achieving a highly accurate, desired test result while minimizing the effects of noise or error signal.

The present invention provides a method for self-testing a transducer system. Broadly, the method contemplates generating a self-test signal which has certain unique properties. The self-test signal should be a sequence of signals or pulses having a finite test time duration "T". The self-test signals should have a relatively flat frequency spectrum. For simplification the self-test signal may switch synchronously or asynchronously between two fixed values and sum to the average of the two values over the test time interval. For further simplification, the self test signal may be unidirectional, that is, one of the fixed values may be zero.

In addition, the signals are generated so that the self-test signal is supplied to one input of the transducer system where it is added to the measured and noise signals to produce the transducer output signal. Furthermore, the signal, or at least the time-varying portion thereof, is supplied to a processing circuit and used for calculating the test result, as hereinafter described.

The present method may be implemented in either analog or digital components. In analog, the output of the transducer and the time varying portion of the self-test signal may be supplied to a conventional analog multiplier, and the product supplied to an integrator and then a time divider to produce the desired result. Alternatively, the signals may be multiplied together, and then processed through a low pass filter to produce the desired output.

This invention also contemplates a system or circuit for self-testing a transducer and its associated circuitry. Similarly, a pulse-generating means is used to output a self-test signal having the properties described hereinabove. The system may be implemented in any of several ways by an analog-to-digital converter and microprocessor; or by a voltage adder, analog-to-digital converter, pulse generator, and microprocessor, or the like.

Regardless of the form of the implementation, the concept of the present invention remains the same. A particular sequence of random or pseudo-random pulses having a finite test time duration and other particular properties are used so as to insure the desired output or desired test result having a highly accurate and unambiguous value together with one or more non-interferring noise or error terms whose values tend to zero over the test time period, and whose magnitudes decrease as the test time duration increases.

These and other objects and advantages of the present invention will be more fully understood after reading the detailed description of the preferred embodiments, the Claims, and the Drawings, which are briefly described hereinbelow:

BRIEF DESCRIPTION OF THE DRAWINGS

FIG. 7 is a multiple flow diagram illustrating the various methods of implementing the self-testing transducer system of the present invention.

DETAILED DESCRIPTION OF THE PREFERRED EMBODIMENTS

The basic concept of principal of transducer self-testing is very simple. It involves injecting a known signal at the input of the transducer system, and more particularily, the transducer-signal conditioner chain, and seeing if you get the expected signal output. There is, however, one major complication. If you want to test a transducer, the transducer must be operating or functioning at the time, and therefore, the transducer will be responding to the measurements at its input such as, i.e. vibration, pressure, or whatever. The transducer system output signal is the combined response to both the self-test signal input and the measurand input or inputs and any noise that may be present. It is desirable to know the response to the self-test signal input alone, and it is to that purpose that this invention is dedicated. A generalized, self-testing system, embodied in analog circuit form, is illustrated in FIG. 1 hereinbelow.

Figure 1:
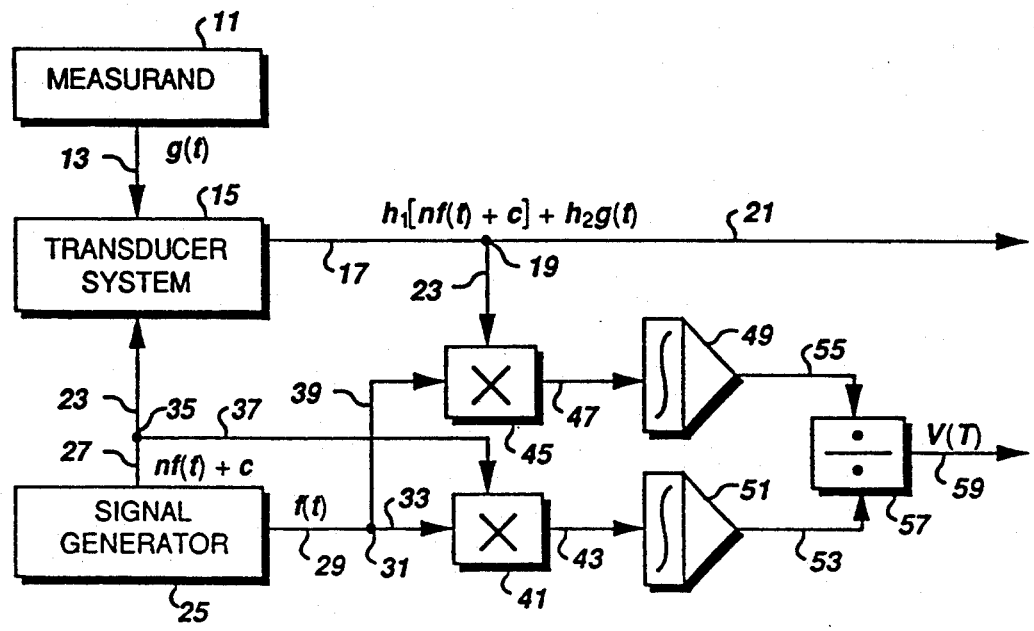
FIG. 1 is a block diagram of one analog embodiment of the self-testing transducer system of the present invention.

In FIG. 1, a source of measurand signals, represented by block 11, transmits one or more input signals g(t) via lead or path 13 from the source of measurand input signals of block 11 to the first or measurand input of the transducer system of block 15. The transducer system of block 15, is meant to include, for example, all of the circuitry normally associated with transducer systems, including, the transducer-signal conditioner chain or network, and related circuitry, such as any associated cabling, amplifiers, filters, and the like.

The transducer system output is taken on lead 17 and supplied to a junction or output node 19. Node 19 then supplies the transducer system output signal on output lead 21 for use as hereinafter required.

Simultaneously, a signal generator 25 is used to supply a self-test signal nf(t)+c to the transducer system 15 via lead or path 27, junction or node 35, and lead or path 23. The self-test signal will ordinarily be an electrical signal, but could be any other suitable stimulus. Similarly, a second output of the signal generator 25 supplies the signal f(t) to junction or node 31 via lead or path 29. The signal f(t) is conveyed from junction or node 31 to the first input of analog multiplier 45 via lead or path 39, and to the first input of analog multiplier 41 via lead or path 33. Node 19 is also connected to the second input of analog multiplier 45, and node 35 is connected to the second input of analog multiplier 41. The output of multiplier 45 is connected via lead or path 47 to the input of a conventional analog integrator 49, and the output of multiplier 41 is connected via lead or path 43 to the input a conventional analog integrator 51. The output of analog integrator 49 is connected via lead or path 55 to the numerator input of analog divider 57 while the output of analog integrator 51 is connected via lead or path 53 to the denominator input of analog divider 57. The output of the divider 57 is taken on the self-test output line or lead 59 and is designated by the symbol V(T).

FIG. 1 represent one analog implementation of the concept enumerated above. It is not necessarily intended to be a practical circuit, but merely to elucidate the basic concept involved. A self-test signal nf(t)+c is injected or fed into one input of the transducer system 15 in any suitable manner while the measurand supplies the input signal input g(t). f(t) is a time varying signal chosen so that its average value over the test interval T is zero. That is, $$\int_0^T f(t)dt = 0 \quad (1)$$

The self-test signal applied to transducer system 15 is the signal f(t) scaled by an arbitrary constant n and offset by another arbitrary constant c. This allows the self-test signal nf(t)+c to be made suitable and convenient for the excitation of the transducer system 15.

Assuming for the moment that transducer system 15 is linear, and that its frequency response is reasonably flat over the relevant range of interest, the output of the transducer-signal conditioner chain or network or the transducer system 15 will be given as $$h_1 \cdot [nf(t)+c] + h_2 \cdot g(t); \quad (2)$$

where $h_1$ is the gain of the transducer system, and more particularly, the gain of the transducer-signal conditioning chain or network for the self-test signal $nf(t)+c$, and where $h_2$ is the conversion gain of the transducer system 15 for the measurand input $g(t)$.

In FIG. 1, the analog multiplier 45 then multiplies the transducer system output signal given above times the signal $f(t)$ to produce the output or product $$h_1nf^2(t)+h_1cf(t)+h_2f(t)g(t). \quad (3)$$

This product term is then fed from the output from the analog multiplier 45 to the input of the analog integrator 49 which integrates the product to produce the output at the end of the test period T $$h_1n\int_o^T f^2(t)dt + h_1c\int_o^T f(t)dt + h_2\int_o^T f(t)\cdot g(t)dt. \quad (4)$$

This output or integral is then fed from the output from analog integrator 49 to the numerator input of analog divider 57. Meanwhile, analog multiplier 41 multiplies the self-test signal $nf(t)+c$ by the signal $f(t)$ to produce the output or product $$nf^2(t)+cf(t). \quad (5)$$

This product term is then fed from the output from the analog multiplier 41 to the analog integrator 51 which integrates the product to output $$n\int_o^T f^2(t)dt + c\int_o^T f(t)dt. \quad (6)$$

The output from the analog divider 57, which is identified as V(T), at the end of the test period T will be the ratio $$V(T) = \frac{h_1n\int_o^T f^2(t)dt + h_1c\int_o^T f(t)dt + h_2\int_o^T f(t)\cdot g(t)dt}{n\int_o^T f^2(t)dt + c\int_o^T f(t)dt}, \quad (7)$$

but the second terms of both the numerator and denominator are zero by the condition that was placed upon $f(t)$. Therefore this equation or signal can be simplified or reduced as follows:

$$V(T) = h_1 + \frac{h_2\int_o^T f(t)\cdot g(t)dt}{n\int_o^T f^2(t)dt}. \quad (8)$$

The first term, $h_1$, is the desired result and, as previously noted, it represents the gain of the transducer system for the self-test signal $nf(t)+c$. The second is an error term. It is known, however, that if $f(t)$ is not correlated with $g(t)$, the second term will go to zero as the test time T goes to infinity. Because of the condition placed upon $f(t)$, the numerator of the error term will do a random walk about zero as T increases while the denominator of the error term will increase without limit. Therefore, when an appropriate signal $f(t)$ is chosen, V(T) approaches $h_1$ as T approaches infinity.

With $h_1$, of course, being the desired self-test output or result sought to be achieved by the present system.

If the self-test signal is pre-determined, as it readily may be, the term $$k = n\int_o^T f^2(t)dt \quad (9)$$

may be calculated once and for all. The output, V(T), of FIG. 2 then will be $$V(T) = kh_1 + h_2\int_o^T f(t)\cdot g(t)dt. \quad (10)$$

Since k is a known constant, the first term of equation (10) is a suitable self-test result while the second term is an error signal. The magnitude of the constant k depends upon the duration of the self-test, increasing as the test duration increases. The error term represents a random walk about zero, so the effect of the error term may be made negligible by selecting a test duration long enough that equation (10) is dominated by its first term.

Figure 2:
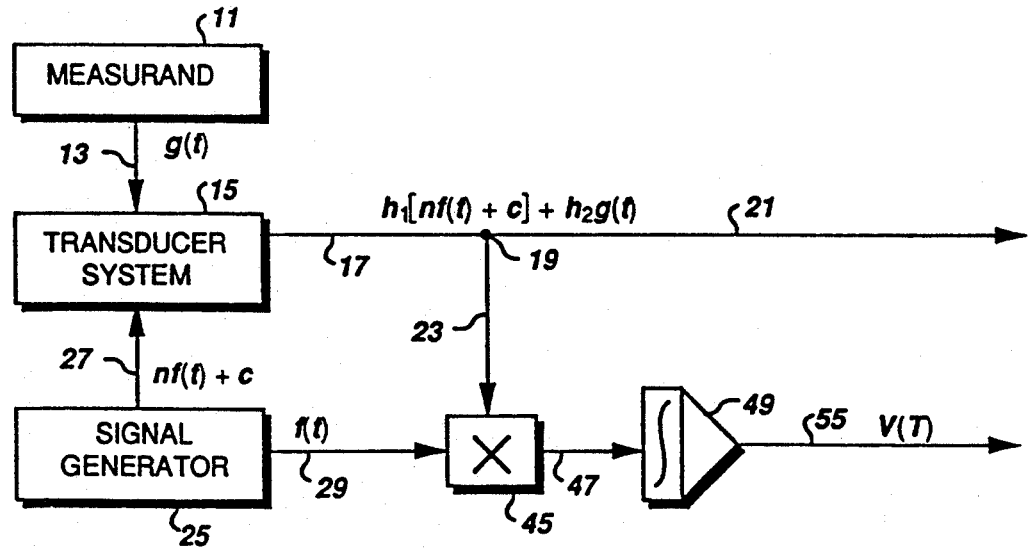
FIG. 2 is a block diagram of a second analog embodiment of the self-testing transducer system of the present invention.
Figure 3:
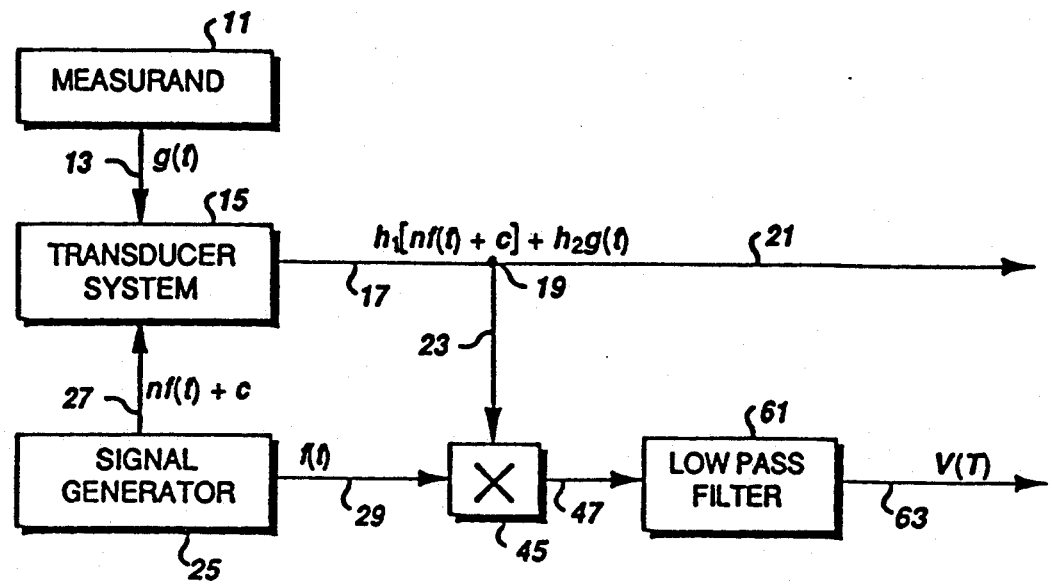
FIG. 3 is a block diagram of a third analog embodiment of the self-testing transducer system of the present invention.

FIG. 3 illustrates another analog implementation of this self-test method. The integrator 49 of FIG. 2 has been replaced with a low-pass filter 61. The output, V(T), is taken from lead or path 63. The output of the low-pass filter is the average of its input, expression (3), repeated here:

$$h_1nf^2(t)+h_1cf(t)+h_2f(t)g(t) \quad (3)$$

The output of the low-pass filter will be sum of the means of the three input terms: 1) $h_1$ multiplied by n times the mean-square value of $f(t)$. Since n and the mean-square value of $f(t)$ are presumed known, this represents a suitable self-test result. 2) The mean value of $h_1cf(t)$. If $f(t)$ is chosen to have no frequency components in the pass band of the filter, this term will be zero. 3) The mean value of $h_2f(t)g(t)$. This is an error term. It has no dc component because $f(t)$ has no dc component. If $f(t)$ and $g(t)$ are uncorrelated, it may be made as small as desired by choosing a sufficiently low corner frequency for the low-pass filter. Of course, the lower the corner frequency the longer it will take for the filter output to stabilize at its steady-state value. As with the other implementations, lower errors require longer self-test durations.

In each implementation there is an error term which is the integral or the average of $h_2f(t)g(t)$. The ratio of the error term to the desired term decreases as the duration of the test increases. Since we have no control over the measurand signal, $g(t)$, there is no way to guarantee that the error term will disappear in a finite time. Nevertheless we can draw some basic statistical conclusions based on reasonable assumptions about the measurand signal, $g(t)$. First of all, it seems quite likely that $g(t)$ will contain a zero frequency or dc term, but the dc term will contribute no error if $f(t)$ has no dc term, i.e., if the condition of expression (1) is met. Secondly, it is likely that $g(t)$ will contain periodic signals, and hence one or more strong spectral lines. The product $f(t)g(t)$ in the time domain is equivalent to the convolution $F(\omega)*G(\omega)$ in the frequency domain. If $f(t)$ is also periodic, it too will have strong spectral lines. If they should, by chance, correspond to one or more strong lines of $g(t)$, the error term of V(T) could be quite large and significant. Therefore it would be prudent to avoid periodicity in f(t). Since there is no reason to suppose, a priori, that one frequency is any more likely to occur in g(t) than another, the spectrum of f(t) should be relatively flat, i.e., white except that it should contain no dc term (condition (1)). This leads to a definition of the optimum signal f(t): f(t) should be a random or pseudo-random signal of finite test time duration T, summing to zero over the test time interval T, and possessing a relatively flat frequency spectrum. Condition (1) is fairly strict; the remaining conditions serve only to improve the probability of a low noise or error measurement.

The self-test signal applied to the transducer system is nf(t)+c. It adds to the measurand signal, g(t). For the best signal to noise ratio, the self-test signal should be as large as possible without the combined signal exceeding the dynamic range of the transducer system.

To estimate the effects of self-test duration on the errors, consider the case where $h_2f(t)g(t)$ is gaussian white noise with noise density $V_n$, band limited to $2f_s$, where $f_s$ is the sampling frequency of a sampled data system. The standard deviation (rms value) of the signal $h_2f(t)g(t)$ will be $$\sigma = V_n \sqrt{2f_s} . \tag{11}$$

In a sampled data system, the error term will be the average value over the self-test duration T of the samples taken from a population with the statistics given by equation (11). The total number of samples taken during a self test will be $N=f_sT$.

The problem at hand is to describe the statistics of the errors, that is, the distribution of errors if self-test were carried out repeatedly. This is equivalent to describing the distribution of sample means taken from the population described by equation (11). The population mean will be zero if f(t) and g(t) are uncorrelated. Each sample mean of N samples corresponds to a single self-test. The mean of the sample means will be the same as the mean of the population, i.e., zero. The distribution of sample means is a well known theorem of statistics given by $$\sigma_x = \frac{\sigma}{\sqrt{N}} . \tag{12}$$

where $\sigma_x$ is the standard deviation of the sample means, $\sigma$ is the standard deviation of the population, and N is the number of samples. If we substitute from equation (11) into equation (12), we find that the distribution of errors in a series of self-tests, i.e., the rms value of the errors, will be $$\sigma_{st} = V_n \sqrt{\frac{2}{T}} . \tag{13}$$

Thus it is seen that the rms value of the errors will diminish as the square root of the self-test period.

The distribution of self-test errors will be gaussian, and will tend to be gaussian even if the population distribution is not gaussian because of the central limit theorem. Equation (13) therefore is more general than the original assumptions would suggest.

Figure 4:
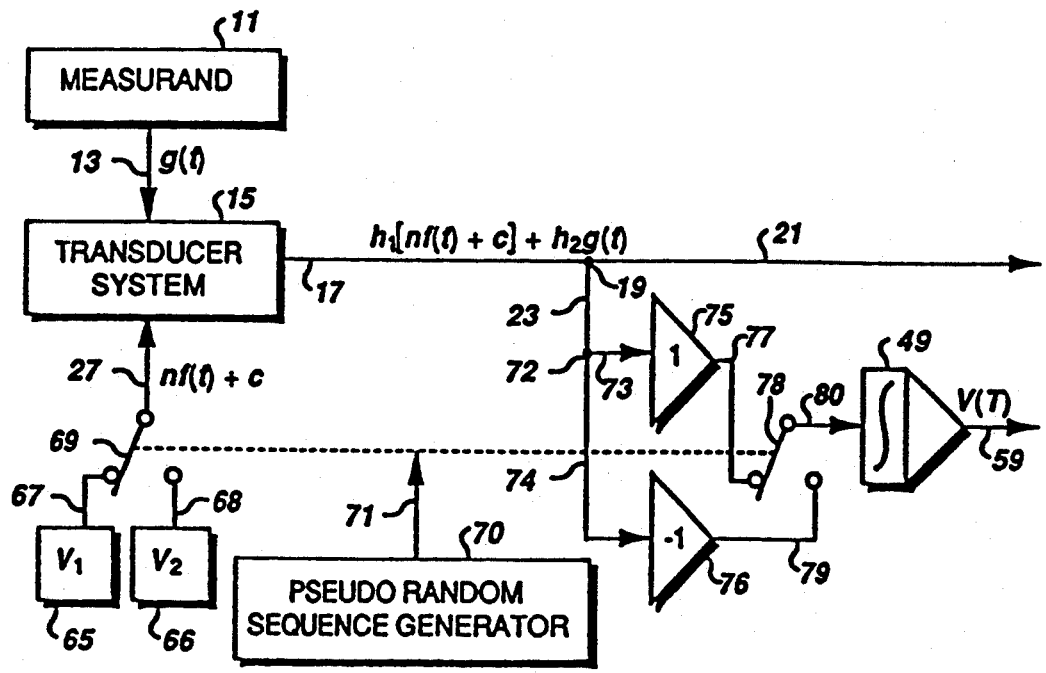
FIG. 4 is a block diagram of a combined analog and digital embodiment of the self-testing transducer system of the present invention.

In one preferred implementation of this self-test method, the self-test signal nf(t)+c is generated by switching randomly or pseudo-randomly between two fixed values. This is illustrated by FIG. 4. Switch 69 driven by pseudo random sequence generator 70 via lead or path 71 switches between fixed voltage source 65 via path or lead 67 and voltage source 66 via lead or path 68. The common terminal of switch 69 is connected to the self-test input of transducer system 15 by lead or path 27. The output of transducer system 15 is connected to the input of amplifier 75 via lead or path 17, junction or node 19, lead or path 23, junction or node 72, and lead or path 73. It is also connected to the input of amplifier 76 by lead or path 74 from junction or node 72. Switch 78, which is also driven by pseudo random sequence generator 70, switches between the output of amplifier 75 connected by lead or path 77 and the output of amplifier 76 connected by lead or path 79. The gain between node 19 and lead 80 is +1 or −1, depending upon the switch position. By this mechanism, f(t) is a signal that switches between +1 and −1 pseudo randomly. Meanwhile switch 69 is synchronously switching between V1 and V2. Since the output of switch 69 is defined as nf(t)+c, it follows that $n=(V_1-V_2)/2$, and $c=(V_1+V_2)/2$. The common lead of switch 78 is connected to the input of integrator 49 by lead or path 80. The output of integrator 49 at the end of the test period T is the desired self-test signal.

The self-test output of this preferred implementation is given by equation (13) with constant k=nT. Thus $$V(T) = \frac{V_1 - V_2}{2} Th_1 + h_2 \int_0^T f(t)g(t)dt \tag{14}$$

FIG. 4 shows the self-test signal being generated by switching between two fixed voltages. Note that an identical result could be achieved in a resistive bridge type transducer by switching a shunt calibration resistor in and out across one of the bridge arms. Other examples will be evident to those skilled in the art.

Figure 5:
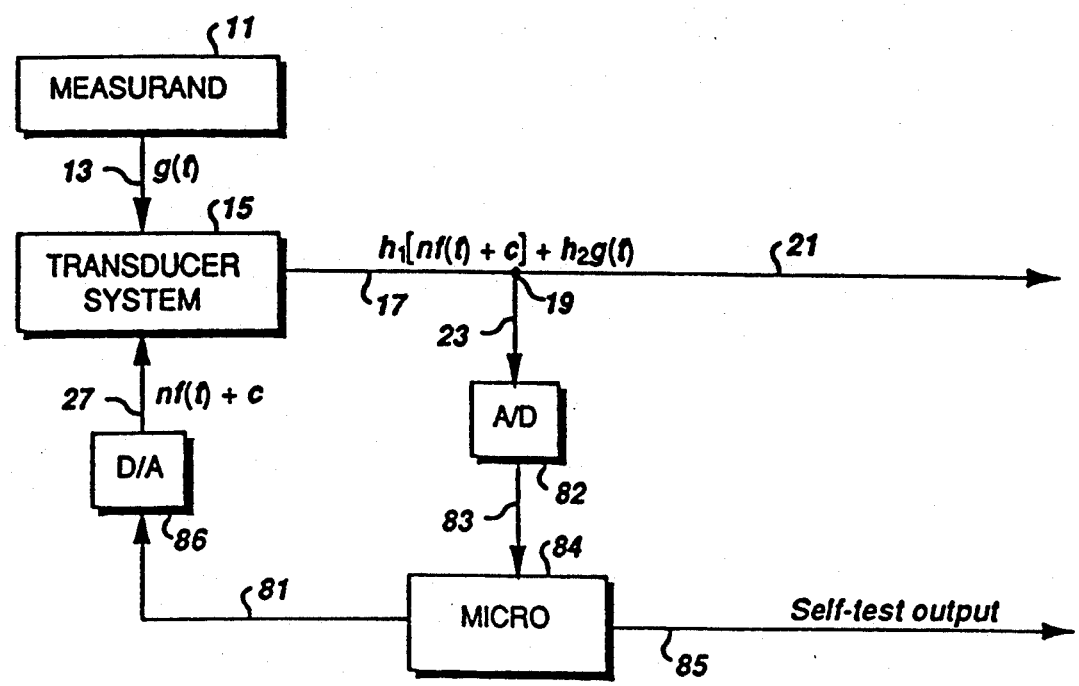
FIG. 5 is a block diagram of a digital embodiment of the self-testing transducer system of the present invention.

Another preferred implementation is shown by FIG. 5. In this case, the output signal from transducer system 15 is connected to analog-to-digital converter 82 via lead or path 17, node 19, and lead or path 23. The digital output of converter 82 is conducted by lead or path 83 to microprocessor 84. Microprocessor 84 is connected to the input of digital-to-analog converter 86 by lead or path 81. Digital-to-analog converter 86 provides the self-test signal to transducer system 15 via lead or path 27. In the preferred implementation, the self-test signal switches pseudo randomly between two fixed values. This means that the digital-to-analog converter need be no more than a single-pole, double-throw switch, or alternatively, an amplifier and level shifter.

Microprocessor 84 internally generates a pseudo random sequence that drives digital-to-analog converter 86. It synchronously multiplies the output of analog-to-digital converter 82 by +1 or −1, and integrates the result. This may be done by setting an accumulator to zero at the beginning of the test, then taking each data sample from analog-to-digital converter 82 and adding it to the accumulator if f(t)=+1 or subtracting it from the accumulator if f(t)=−1. At the end of test period T the accumulator will hold the digital result of the self-test, a number proportional to $h_1$, which can be displayed or read in any suitable manner. This output is indicated as lead or path 85, labeled Self-test output.

So no matter what implementation is chosen, either digital or analog, there will always will be a trade-off between self-test accuracy and the length of time it takes to make the test determination; and the errors will always diminish in value or magnitude as the square-root of the measurement time.

It is to be expected that the self-test will usually be conducted when things are relatively quiet, i.e., when g(t) is small. This further helps to make the error small. If the transducer is being used in a test environment, self-test probably will be run before and after the test, but not while the test is actually in progress. In a monitoring environment, large dynamic signals are usually assigned of a fault condition, and the operator probably would not run self-testing in the middle of a fault condition. Note that large static signals, as might be seen in pressure measurements, do not contribute to self-test errors.

It will, therefore, be observed that it is a major advantage to use a random or pseudo-random signal to do self-testing and calibration in transducer system so that the external signal from the environment during the test period will not greatly effect the accuracy of the test or calibration if the self-test period is long enough. Extensive testing was done on the method and concept of the present invention and the results are very briefly discussed herein below. The digital system used to embody the self-test transducer system and used for test purposes is shown in FIG. 6.

Figure 6:
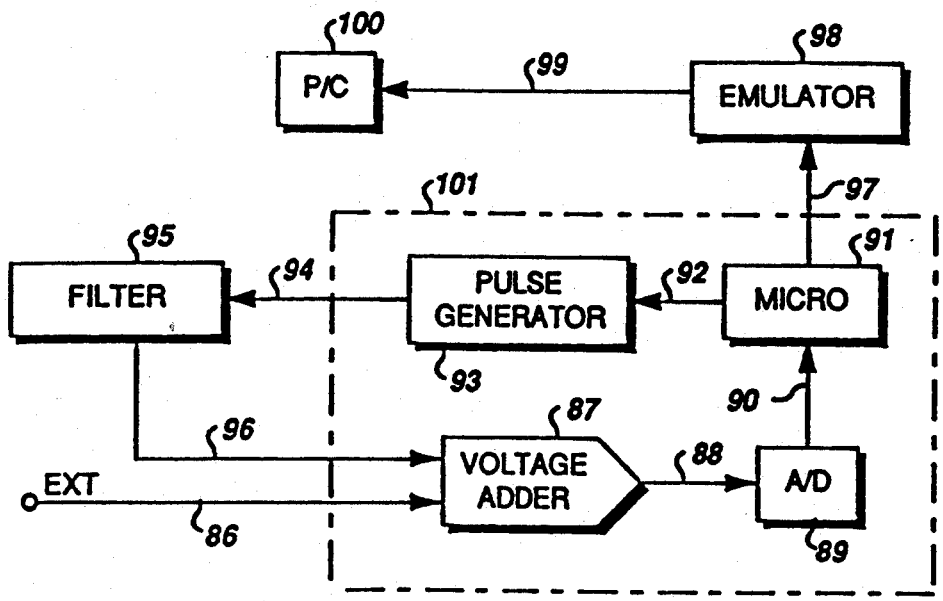
FIG. 6 is a block diagram of a test system used to prove out the self-testing transducer system of the present invention.

FIG. 6 illustrates a self-test system 101 which includes a digital pulse generator 93. The output 94 from the pulse generator 93 is connected to the input of a filter 95, while the output of the filter is taken on lead 96 and supplied to the first input of adder 87. The signal nf(t) +c is generated by the pulse generator 93. The second input of the adder is supplied with the external signal, which simulates the transducer output h2g(t) signal previously described, on input lead 86.

The output of the voltage adder 87 is connected via lead 88 to the analog input of an analog-to-digital converter 89. The digital outputs of the A/D converter 89 are connected, via lead 90, to one input or set of inputs of a microprocessor 91. A control output of the microprocessor 91 is connected via lead 92 to a control input of the pulse generator 93 to control the generation of the self-test signals or pulses as previously described. The output of the microprocessor 91 is supplied or connected, via lead 97, to supply the self-test output signal V(t) to the input of an emulator 98 which is used to facilitate signal analysis. The output of the emulator 98 is then connected, via lead 99, to the input of a P/C 100 such as a conventional IBM/PC or any suitable make or model.

In the block diagram of FIG. 6, the circuit actually built to test the present concept and its method of operation is shown. The microprocessor 91 is a conventional 8-bit microprocessor or microcontroller, such as a conventional, off-the-shelf model 80C552, which was chosen because it was intended that it be used in the smart sensor application specific box of the particular transducer under test. The microprocessor was running at its maximum speed of 12 MHz so that the instruction cycle time was one usec. The Metal CE emulator was used for the emulator of block 98 solely to facilitate testing. The pulse generator of block 93 was actually built or constructed with analog switches, and it was used to generate outputs of +3, 0, or −3 volts under control of the microprocessor.

The voltage adder 87 was built with operational amplifiers, and its output was equal to the sum of the input voltages divided-by-two. The sampling analog-to-digital converter was used to measure bipolar ±3 volt voltage inputs and convert them into twelve bit, 2's compliment numbers. The pulse generating period and sampling rate was controlled by the microprocessor to be 100 usec. The external filter used in this embodiment was a conventional Tektronix model number AM502 unit having a gain of one.

The result of all of the tests completely proved the viability of the method and system of the present invention for self-testing transducer systems. A variety of conclusions can be drawn from the tests conducted, including: the DC offset in the voltage adder and the DC component in the external signal g(t) did not increase the error in the first order because the pseudo-random signal generated by the microprocessor does not have a DC component.

Furthermore, the external signal g(t) having a frequency closer to the pseudo-random self-test signal spectrum caused some, but not significant, increase in error. This is because the pseudo-random self-test signal is not a truly random function.

Yet further, an external signal having a frequency higher than five kHz (half the sampling frequency of 10 kHz) was mirrored back to a frequency less than five kHz and, although aliased, was still integrated to zero just like a frequency of less than five kHz.

Still further, the error and consistency of error increased with lower test time because of the number of samples for the digital averaging was less. This matches quite well with the theoretical equation and calculations.

Yet further, at least three decades of bandwidth were needed for the sensor under test. However an error of a few percent caused by the bandwidth limitation will not create any real problem in the actual implementation of the system because the value of the bandwidth is always known, and so, can be corrected in the final test result.

Again, for the particular microcontroller used, which is not a DSP processor, a 10 kHz sampling rate is a maximum using the current software of the present invention.

Lastly, the peak of the external signal plus the peak of the self-test signal had to be less than the full-scale value in order for the present scheme or concept to work efficiently.

In FIG. 6, the operation of the microprocessor or microcontroller 91 is preferably, under program control. The particular program used is described in the Appendix (which is not reproduced here, but is available in the application file). However, a brief software description is in order.

The pseudo code is shown hereinafter. The program listing in assembly language is shown in the Appendix. The program was used to generate an 8-bit pseudo-random number in every cycle of 100 microseconds by a linear congruence method described as follows:

Next randon number =[(current randon number * Multiplier)+Increment] mod 256. A high-level language program was written to prove that if the Multiplier is a multiple of 4+1, and if the increment is odd, then the equation listed above generates a pseudo-random number sequence having a period of 256. This means that no same random number appears twice during the 256 iterations of the above equation. After the 256 cycles were done, the program picked up the next multiple of the 4+1 Multiplier and generated another 256 random numbers. After all Multipliers were used, the program picked up the next odd increment, and so on. In this way, no same sequence was repeated during the test period.

One bit of the random number was used to determine the sign of the pulse. It was, in the preferred embodiment hereof, a +3V if the bit was a "1"; and a −3 V, if "0". Since, as noted above, the program went through all numbers from 0 to 255 every 256 cycles, the output of the pulse generator did not have a DC component when integrated over the test period because the numbers of high and low pulses were identical or the same. At the end of each pulse, the program called for a reading of the analog-to-digital converter. If the pulse read was positive, it was added to the reading in the high-accumulator, otherwise, it was added to the reading in the low-accumulator. The final result was equal to high-accumulator minus low-accumulator. This is, in practicality, equivalent to digital integration. When the final self-test result was found, the program turned on the LED indicator, and the system stopped. The user could then use the emulator 98 and the IBM PC 100 to read the results of the test.

The program used to generate the pseudo code is set forth hereinbelow:

PSEUDO-CODE PROGRAM

Initialization, Set timer to flag every 100 usec
Clear accumulators LOW_ACC and HIGH_ACC
RAND=0, MUL=253, INC=255
PULSE=bit BBIT of RAND, (High pulse=1, Low pulse=0)
Wait til timer flags for cycle end
Send PULSE
Do
LASTPULSE=PULSE
RAND=(MUL*RAND+INC) mod 256
PULSE=bit BBIT of RAND, (High pulse=1, Low pulse=0)
Wait til timer flags for cycle end
Get SAMPLE from ADC
Send PULSE
If LASTPULSE=low
LOW_ACC=LOW_ACC+SAMPLE
else
   HIGH_ACC=HIGH_ACC+SAMPLE
   Loop until RAND=0
   MUL=MUL−4
   Loop until MUL<0
   INC=INC−2
   Loop until INC=INC_LIMIT
   RESULT=HIGH_ACC-LOW_ACC
Turn LED on to signify done The program listing for the system of FIG. 6 is set forth as FIG. 8 in the accompanying drawings.

FIG. 7 illustrates three different methods of utilizing the self-test methods and systems of the present invention. In FIG. 7, block 102 represents the step of providing a transducer system having at least one environmental signal input g(t). Block 103 represents the step of generating a specific signal f(t) and a self-test signal nf(t)+c. The path 105 connects the step of block 102 with the step of block 107. Path 109 connects block 103 with the step of block 107 which includes the step of feeding or injecting the self-test signal nf(t)+c into the transducer system.

A flow path 125 proceeds from the step of block 107 to a path identification or indication block 123, represented as a circle containing therein the initial "A". Flow path 129 then connects the path identification block 123 with block 127 representing the step of multiplying the transducer output signal times the self-test signal f(t). The output of block 127, is connected to the input of block 131 via flow path 133. Block 131 represents the step of integrating the product produced by the step of block 127. The output of block 131 is then supplied via lead 139 to the step of outputting the desired output kh, plus one or more error terms as previously described and as represented by block 119.

The second flow path 143 from block 107 is connected to a second flow path identification block 141 which is represented as a circle containing the initial "B". Flow path 147 connects the flow path identification block 141 with block 145. Block 145 represents the step of multiplying the transducer output signal by the signal f(t), and the resultant product produced thereby is supplied, via flow path 151, to block 149. Block 149 represents the step of low-pass filtering the product, and the output of the filtering step of block 149 is supplied, via flow path 153, to the outputting step of block 119, as previously described.

The third flow path 157 is shown as connecting block 107 to a third flow path identification block 155 which is represented by a circle containing the initial "C". The identification block 155 is connected via flow path 161 to block 159. Block 159 represents the digital step of analog-to-digital converting the transducer output signal, and block 159 is connected, via flow path 165, to block 163. Block 163 represents the step of processing the inputted signals, and it is connected, via lead 167, to the outputting block 119, as previously described.

It will be seen that the method represented by flow path "A" is a generalization of the system and method of the present invention, and represents the method of operation of the systems of FIGS. 2 and 4. Flow path "B" represents the method of operation of the analog system of FIG. 3, and flow path "C" represents the method of operation of the digital system of FIG. 5, previously described herein.

It will be understood that the various analog-to-digital systems disclosed, as well as the methods of operation thereof, and the various embodiments of the self-testing methods of the present invention, can be implemented in many different analog and/or digital systems, and are not to be taken as being limited only to those systems shown, which are for illustrative purposes only.

The basic concept of the present invention is to provide a unique, custom-tailored, self-test signal having the properties previously stated herein which enables the self-test output signal to provide a highly accurate representation of the desired self-test result $kh_1$, while simultaneously minimizing the effect, value, or magnitude of the remaining noise or error terms, as discussed previously herein. Therefore, it will be well-known to those skilled in either the analog or digital arts to implement a system, and indeed many types of systems, embodying the broad concept of the present invention, without in any way limiting the invention thereto.

It will also be understood that various substitutions, alterations, variations, substitutions, and changes can be made in both the systems and the methods described herein without departing from the spirit and scope of the present invention, which is limited only by the appended claims.

What is claimed is:

1. An improved method of self-testing a transducer system, said transducer system having a measurand signal input for receiving a measurand signal, and a self-testing signal input for receiving a self-test signal, and a transducer system output for outputting a combined transducer system output signal, said improved method comprising the steps of:
   generating at least one of a random and a pseudo-random self-test signal and supplying same to said self-testing signal input to be combined with said measurand signal and supplying same to a signal processor; and
   simultaneously processing both the self-test signal and the combined transducer system output signal in the processor to produce the desired self-test result plus at least one noise term whose relative magnitude decreases as the test time increases.

2. The improved method of claim 1 wherein said step of generating includes generating said pseudo-random self-test signal.

3. The improved method of claim 2 wherein said generating step includes the step of generating a pseudo-random self-test signal sequence having a finite test time duration "T".

4. The improved method of claim 3 wherein said generating step further includes the step of generating said self-test signal wherein said self-test signal is restricted to switching between two fixed values.

5. The improved method of claim 4 wherein said generating step includes the step of generating said self-test signal wherein self-test signal has the property of summing to the average of the two values over the test time duration "T".

6. The improved method of claim 5 wherein said generating step includes the step of generating said self-test signal wherein said self-test signal has a relatively flat frequency spectrum.

7. The improved method of claim 5 wherein said step of generating said self-test signal includes generating a self-test signal which has the property of being unidirectional.

8. The improved method of claim 1 wherein said step of generating includes generating a pseudo-random self-test signal $nf(t)+c$ comprising a sequence of pulses having a finite test time duration "T" wherein f(t) is restricted to two fixed values and sums to zero over the test time interval "T", and wherein "n" and "c" are arbitrary scaling and off-setting constants respectively.

9. The improved method of claim 8 wherein said measurand signal is given by "g(t)", said self-test signal is given by "$nf(t)+c$", and said transducer system output signal is given by $$H_1(nf(t)+c)+h_2g(t)$$

where "$h_1$" is the gain of the transducer system for the self-test signal $nf(t)+c$, and "$h_2$" is the conversion gain for the measurand signal g(t).

10. The improved method of claim 9 wherein said step of processing includes the steps of:
   multiplying the signal f(t) times the transducer system output signal to produce the product $$h_1nf^2(t)+h_1cf(t)+h_2F(t)g(t);$$

integrating said product over the test time duration period "T"

to get the self-test output V(t), where:

$$V(t)=nh_1f^2(t)dt+ch_1f(t)dt+h_2f(t)g(t)dt$$

wherein the first term is a signal term proportional to $h_1$, and the second term is zero, and the third term is an error term and the expected volume of the signal term to the noise term increases as the test time duration "T" increases.

11. The improved method of claim 10 wherein if the signal f(t) has no DC component, then the noise term will contribute no DC error even if g(t) does contain a DC component.

12. The improved method of claim 9 wherein said step of processing includes:
   multiplying the signal f(t) times the transducer system output signal $$h_1(nf(t)+c)+h_2g(t)$$

to get the three-term product $$h_1nf^2(t)+h_1cf(t)+h_2f(t)g(t)$$

and low-pass filtering the three-term product such that the first term reduces to the desired self-test result $kh_1$ and the other two terms constitute noise terms each tending toward zero as the corner frequency of the low-pass filter is reduced.

13. The improved method of claim 9 wherein said step of processing includes digital processing including the steps of:
   analog-to-digital converting the transducer system output signal to digital values equivalent thereof;
   providing a microprocessor;
   feeding the equivalent digital values into the microprocessor;
   supplying the signal f(t) into the microprocessor;
   combining said input signals; and
   outputting a test result which is proportional to the desired self-test result $h_1$ plus at least one error term.

14. The improved method of claim 13 wherein said step of generating said pseudo-random self-test signal includes providing a digital clock and a clock line and utilizing said clock line to supply said self-test signal to said self-test input of said transducer system.

15. The improved method of claim 13 wherein said step of generating said pseudo-random self-test signal includes:
   providing a microprocessor, a clock, and a clock line;
   calculating said self-test signal in said microprocessor; and
   feeding said self-test signal to said self-test input of said transducer system.

16. The improved method of claim 1 wherein said step of processing includes analog processing.

17. The improved method of claim 1 wherein said step of processing includes digital processing.

18. The improved transducer system of claim 1 wherein said self-testing signal is unidirectional.

19. A method for self-testing a transducer system, said transducer system having an environmental signal input for receiving an environmental input signal g(t), a self-testing signal input for receiving a self-testing input signal, and a transducer system signal output for outputting a transducer system output signal, said method comprising the steps of:

generating the self-testing input signal (nf(t)+c) which is a pseudo-random sequence of pulses having a finite test time duration "T", where nf(t)+c is restricted to two fixed values, f(t) sums to zero over the time interval "T", and where f(t) has a relatively flat frequency spectrum;

injecting said generated self-testing input signal into the self-testing signal input of said transducer system to output said transducer system output signal; and coupling the transducer system output signal and the self-test input signal to a signal processor; and simultaneously processing said transducer system output signal and the self-testing input signal f(t) to generate a test result output signal having one term which represents the desired test result and at least one error term whose relative value decreases with the increase in the test time T.

20. The method of claim 19 wherein said step of processing includes digital processing.

21. The method of claim 19 wherein c=0.

22. The method of claim 19 wherein n=1.

23. The method of claim 19 wherein said step of processing includes the steps of:

multiplying the self-testing signal f(t) times the transducer system output signal $$h_2(nf(t)+c)+h_2g(t);$$

where $h_1$ is the gain of the transducer system for the self-testing input signal nf(t)+c, and where $h_2$ is the conversion gain of the transducer system for the environmental signal g(t) to get the resultant product $$h_1nf_2(t)+h_1cf(t)+h_2f(t)g(t);$$

integrating said product with respect to time over the finite time interval "T"; to obtain $$V(T)=nh_1 r f^2(t)dt+ch.rf(t)dt+h_2 Tf(t)g(t)dt$$

which reduced to:

$$V(T)=kh_1+h_2 f(t)g(t)dt$$

wherein k is a known constant and $kh_1$ is the desired self-test result and the remaining term is said error term.

24. The method of claim 19 wherein said steps of processing includes the steps of:

generating the signal f(t) with a microprocessor;

converting the transducer system output signal from analog to digital;

storing the digital conversion in said microprocessor; and combining the signals in said microprocessor to output a self-test output signal having one term which is proportional to the desired self-test output and at least one error term.

25. The method of claim 19 wherein said step of processing further includes the steps of:

multiplying the signal f(t) times the transducer system output signal; and low pass filtering the product to output the self-test result V(t), where $$V(t)=avg(nh_1 f^2(t))+avg(ch_1 f(t))+avg(h_2 f(t)g(t))$$

which reduces to $$V(t)=kh_1+avg\{ch_1 f(t)\}+avg\{h_2 f(t)g(t)\}$$

where k is a known constant and $kh_1$ is the desired self-test result and the remaining terms are error terms each of which tends to zero.

26. The method of claim 19 wherein said step of processing includes analog processing.

27. An improved transducer circuit having a first input for receiving an environmental input signal and a transducer output for outputting a transducer output signal, the improvement including a self-testing system comprising:

a second input means for injecting a self-test input signal into said transducer circuit;

means for generating a self-test input signal comprising a pseudo-random sequence of digital signals having a finite time duration "T", wherein said signals are restricted to two fixed values, wherein said signals sum to the average of the two values over the test time interval "T", and wherein said signals have a relatively flat frequency spectrum;

means for supplying said generated sequence of signals to said second input means; and means responsive to both said self-test input signal and to said transducer output signal for producing a test result signal having one term which represents the desired self-testing result plus at least one other error term whose effect is substantially minimized.

28. The improved transducer circuit of claim 27 wherein said processing means includes digital logic processing means.

29. The improved transducer circuit of claim 28 wherein said generating means includes a digital logic circuit means.

30. The improved transducer circuit of claim 29 wherein "n" is one.

31. The improved transducer circuit of claim 30 wherein said processing means comprises:

analog-to-digital converter means having an input and an output for converting a sequence of analog signals into a corresponding sequence of digital signals;

means for connecting said transducer circuit output to said analog-to-digital converter means input for supplying said transducer output signal thereto;

microprocessor means having at least first and second inputs and a microprocessor output;

means for supplying the digital representation of said transducer output signal to said first input of said microprocessor means;

means for supplying said signal f(t) to said second input of said microprocessor means; and said microprocessor means for processing said inputs to output a self-testing output signal V(t), where $$V(t)=h_1+h_1 f(t)+h_2 f(t)g(t)$$

where $h_1$ is the gain of the transducer circuit for the self-test input signal and $h_2$ is the conversion gain of the transducer circuit for the environmental signal g(t), $h_1$ being the desired test result and the remaining terms being error terms whose average values tend to zero over the test time period and whose magnitude decrease with increases in the test time.

32. The improved transducer circuit of claim 30 wherein said processing means comprises of:
- an analog multiplying means having first and second input and a multiplier output;
- means for supplying said self-test input signal f(t) to said first input of said analog multiplying means;
- means for supplying said transducer output signal to said second input of said analog multiplying means;
- said analog multiplying means for multiplying said self-testing input signal times said transducer output signal and producing the product $$h_1 f^2(t) + h_2 f(t) g(t);$$

where $h_1$ is the gain of the transducer circuit for the signal f(t) and $h_2$ is the conversion gain of the transducer circuit for the measurand signal g(t);
- and means for dividing the integrated product by the time "T" to produce the self-test output signal V(T), where $$V(T) = \int_0^T \frac{\{h_1[f(t) + f^2(t)] + h_2 f(t) g(t)\} dt}{T}$$

$$V(T) = h_1 + \frac{h_2 \int_0^T f(t) g(t) dt}{T}$$

where $h_1$ is the desired self-test result and the remaining term represents a noise term whose value decreases as the test time "T" increases.

33. The improved transducer circuit of claim 29 wherein n=1, c=0, and wherein said self-test input signal is given by f(t).

34. The improved transducer circuit of claim 29 wherein one of the fixed values is zero, and wherein said self-test input signal is unidirectional.

35. The improved transducer circuit of claim 27 wherein said processing means includes analog circuit processing means.

36. The improved transducer circuit of claim 27 wherein said environmental input signal is given by g(t), and said self-test input signal is given by [[](nf(t)+c)[]] where "n" and "c" are constants and wherein f(t) is a pseudo-random sequence of digital pulses having a finite time duration "T", where f(t) is restricted to values of +1, sums to zero over the test time interval "T", and has a relatively flat frequency spectrum.

37. The improved transducer circuit of claim 27 wherein said transducer circuit is operably disposed on an integrated circuit chip and wherein at least a substantial portion of said self-testing system is operably disposed on said same integrated circuit chip.

38. An improved transducer system on an integrated circuit chip and including a transducer, transducer signal conditioning means, a first transducer system input for receiving at least one of a testing and a monitoring signal g(t), a second transducer system input for receiving a self-testing signal, and a transducer system output for supplying a transducer system output signal, said improvement comprising:
- a self-testing subsystem operatively disposed at least partially on said integrated circuit chip, said self-testing system including:
  - means for producing a self-test signal (nf(t)+c), where "n" and "c" are abitrary constants and where the signal f(t) is a pseudo-random sequence of signals having a finite time duration "T", and being restricted to the values of ±1, summing to zero over the test time period "T", and having a relatively flat frequency response;
- means for feeding said self-testing signal to said second transducer system input; and
- signal analyzing means responsive to said signal f(t) and to said transducer system output signal for producing a self-test output signal having one term representing the desired self-test output result and at least one error term whose value decreases as the test time interval "T" increases.

* * * * *

UNITED STATES PATENT AND TRADEMARK OFFICE
CERTIFICATE OF CORRECTION

PATENT NO. : 5,220,519
DATED : June 15, 1993
INVENTOR(S) : Eldon E. Eller

It is certified that error appears in the above-identified patent and that said Letters Patent is hereby corrected as shown below:

Col. 18, line 10, delete "+" and insert --±--.

Signed and Sealed this

Fifteenth Day of February, 1994

Attest:

BRUCE LEHMAN

*Attesting Officer*  Commissioner of Patents and Trademarks

UNITED STATES PATENT AND TRADEMARK OFFICE
CERTIFICATE OF CORRECTION

PATENT NO. :    5,220,519
DATED      :    June 15, 1993
INVENTOR(S) :   Eldon E. Eller It is certified that error appears in the above-identified patent and that said Letters Patent is hereby corrected as shown below:

Col. 18, line 6, delete "[[](nf(t)+c)[]]" and insert --(nf(t)+c)--.

Signed and Sealed this

Seventh Day of June, 1994

Attest:

BRUCE LEHMAN

*Attesting Officer*   *Commissioner of Patents and Trademarks*